United States Patent [19]

Cartwright, Jr.

[11] 4,064,506
[45] Dec. 20, 1977

[54] CURRENT MIRROR AMPLIFIERS WITH PROGRAMMABLE CURRENT GAINS

[75] Inventor: James Murgen Cartwright, Jr., Cambria Heights, N.Y.

[73] Assignee: RCA Corporation, New York, N.Y.

[21] Appl. No.: 675,207

[22] Filed: Apr. 8, 1976

[51] Int. Cl.² .................. H03K 13/02; H03F 3/16
[52] U.S. Cl. .................. 340/347 DA; 307/304; 330/288
[58] Field of Search .......... 330/22, 35, 17, 19; 323/4; 307/304; 340/347 DA

[56] References Cited

U.S. PATENT DOCUMENTS

| Re. 28,633 | 11/1975 | Pastoriza | 340/347 DA |
|---|---|---|---|
| 3,392,342 | 7/1968 | Ordower | 330/22 |
| 3,801,831 | 4/1974 | Dame | 307/304 |
| 3,855,541 | 12/1974 | Leidich | 323/4 |
| 3,936,725 | 2/1976 | Schneider | 323/4 |
| 3,940,760 | 2/1976 | Brokaw | 340/347 DA |
| 3,946,327 | 3/1976 | Hsu | 330/22 |
| 3,978,473 | 8/1976 | Pastoriza | 340/347 DA |
| 3,984,830 | 10/1976 | Buchanan et al. | 340/347 DA |
| 4,024,415 | 5/1977 | Matsuura | 307/304 |

FOREIGN PATENT DOCUMENTS 1,141,338  12/1962  Germany .................. 330/22

OTHER PUBLICATIONS

Hartley, Digital Word Sets Gain Amplifier Electronics, July 10, 1975, pp. 94, 95.

*Primary Examiner*—Felix D. Gruber
*Attorney, Agent, or Firm*—H. Christoffersen; S. Cohen; A. L. Limberg

[57] ABSTRACT

A current mirror amplifier in which at least one of the mirroring transistors is a composite transistor in which the number of simple transistors parallelled to form the composite transistor can be selected in response to a digital signal to program the current gain of the current mirror amplifier in accordance with said digital signal. Current mirror amplifiers with programmable current gains are useful, for example, in the multiplication and/or division of analog information by digital multipliers, and in digital-to-analog conversion.

13 Claims, 6 Drawing Figures

CURRENT MIRROR AMPLIFIERS WITH PROGRAMMABLE CURRENT GAINS

The present invention relates to current mirror amplifiers with programmable current gains, useful, for example, in the multiplication and/or division of analog information by digital multipliers, and in digital-to-analog conversion.

A current mirror amplifier (CMA) is a current amplifier, the current gain of which is defined by the ratio of the transconductances of transistors. In a CMA using enhancement-mode field effect transistors (FET's) direct-coupled drain-to-gate feedback adjusts the source-to-gate potential of a "master" mirroring transistor, which may be a composite transistor comprising a number of simple transistors in parallel connection, to adjust its drain-to-source conductivity for conducting an input current. The source-to-gate potential of the "master" mirroring transistor is then applied as the source-to-gate potential of a "slave" mirroring transistor, which may be a composite transistor comprising a number of simple transistors in parallel connection, causing it to conduct an output current between its drain and source electrodes. The current gain of the CMA is the ratio of the transconductance of the "slave" transistor to that of the "master" transistor.

Applicant's invention is embodied in an improved current mirror amplifier wherein at least one of said master and slave transistors is a composite transistor comprising a plurality of simple transistors "selectively paralleled" in response to a control signal manifestation, thereby to provide for programmable current gain. "Selective parallelling" refers to selective switching arrangements in which one of the simple transistors is selectively used alone or in parallel with selected ones of the other simple transistors available for use in the composite transistor configuration.

In the drawing, in which each of the FIGURES embodies an aspect of the present invention:

In the detailed description, source-to-gate potentials will be referred to as $V_{GS}$'s; source-to-drain potentials as $V_{DS}$'s; and drain-to-source currents as $I_{DS}$'s. These quantities will be subscripted with the identification numeral of the transistor to which they pertain.

Figure 1:
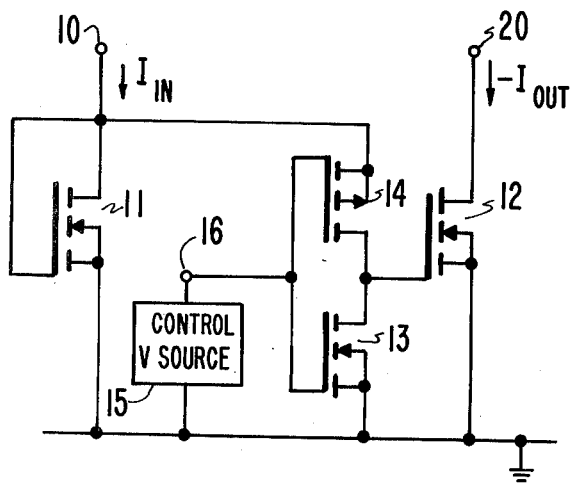
FIG. 1 is a schematic diagram of a CMA having its current gain selectably switched between zero and a predetermined value.

In FIG. 1, direct-coupled drain-to-gate feedback adjusts $V_{GS11}$ so the conductivity of the channel of FET 11 just suffices to cause the input current $I_{IN}$ to flow as $I_{DS11}$. Assuming FET 14 to be in its conducting state and its channel to be of low impedance, $V_{GS11}$ is applied as $V_{GS}$ to another FET 12 and causes an $I_{DS}$ therein with substantially the following value, assuming the n-channel FET's 11 and 12 to be constructed simultaneously using the same process steps.

$$I_{DS12} = (L_{11}W_{12}I_{DS11})/(L_{12}W_{11}) = (L_{11}W_{12}I_{IN})/(L_{12}W_{11}) \quad (1)$$

where $L_{11}$ and $W_{11}$ are the length and width respectively of the channel of FET 11 and where $L_{12}$ and $W_{12}$ are the length and width respectively of the channel of FET 12.

$V_{GS11}$ is selectively applied as $V_{GS12}$ responsive to non-conduction of p-channel FET 13 and conduction of n-channel FET 14. FET's 13 and 14 are switched into this condition whenever a control voltage supplied by source 15 to a terminal 16 at the interconnection of their gate electrodes, has first value which is either substantially zero or is negative. At other times, the control voltage supplied from source 15 will have a substantial positive value causing FET 14 to be non-conductive, interrupting the application of $V_{GS11}$ as $V_{GS12}$, and causing FET 13 to be conductive, discharging stray capacitance at the gate electrode of FET 12 and causing $V_{GS12}$ to be zero-valued. With $V_{GS12} = 0$, $I_{DS12} = 0$. The output current $I_{OUT}$ from terminal 21 equals $-I_{DS12}$.

Figure 2:
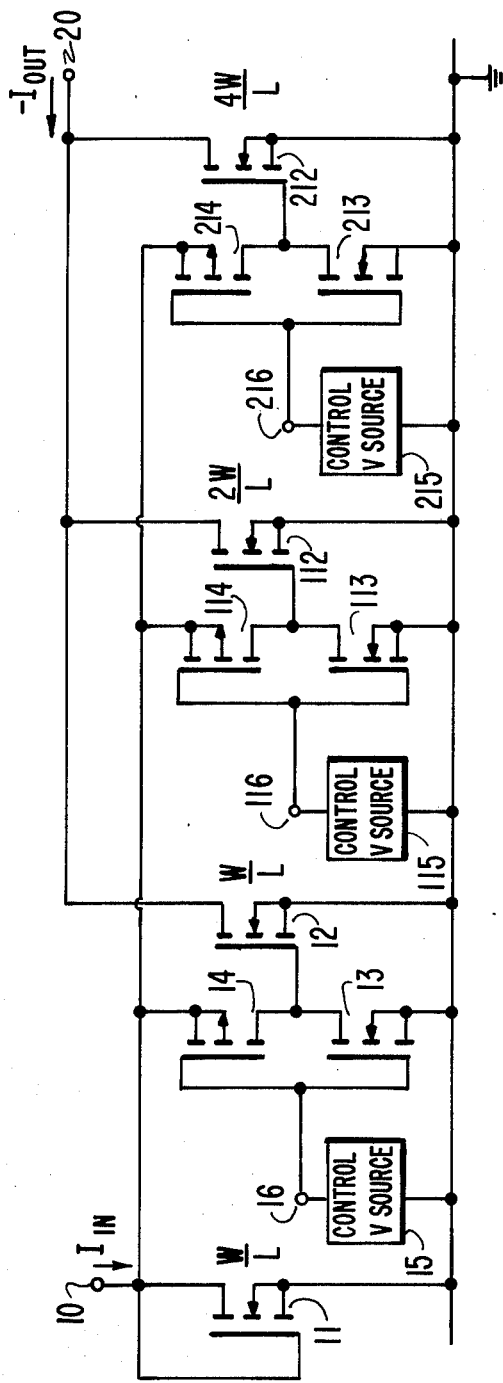
FIG. 2 is a schematic diagram of a circuit for multiplying analog information by a digital number, constructed using the FIG. 1 circuit as a building block.

FIG. 2 shows a circuit used for multiplying analog information by digital numbers or, more specifically, as a digital-to-analog converter. It is built up using the FIG. 1 circuit as a basic building block. Elements 12, 13, 14, 15 and 16 are replicated a first time as elements 112, 113, 114, 115 and 116, respectively, and a second time as elements 212, 213, 214, 215 and 216, respectively, except that FET's 112 and 212 have (W/L)'s in 2:1 and 4:1 ratios, respectively, with the (W/L) of FET 12. Sources 15, 115 and 215 may be viewed collectively as a parallel-bit digital signal source. Digital control numbers can be defined with each successive place representative of the output of source 15, 115 and 215 in that order, with the relatively low and relatively high control voltages provided by each source defined respectively as one and zero. The following table descriptive of the digital-to-analog conversion provided by the FIG. 2 circuit can then be developed.

| digital control signal | current gain |
|---|---|
| 000 | 0 |
| 001 | 1 |
| 010 | 2 |
| 011 | 3 |
| 100 | 4 |
| 101 | 5 |
| 110 | 6 |
| 111 | 7 |

Any analog input information is directly multiplied by a factor expressed in radix-2, or binary, form.

The number of times elements 12, 13, 14, 15 and 16 are replicated with the (W/L) ratio of the output FET being doubled in each replication is not limited to two times, of course. Digital-to-analog converters of the type shown in FIG. 2 can be characterized as follows: the master mirroring transistor is a simple transistor, and the slave mirroring transistor is a composite transistor comprising selectively paralleled simple transistors.

Figure 3:
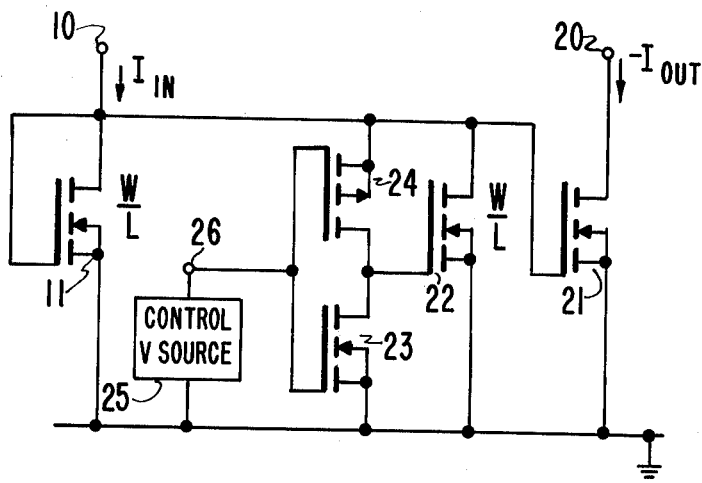
FIG. 3 is a schematic diagram of a CMA having its current gain selectably switched between relatively low and relatively higher predetermined values.

FIG. 3 shows a CMA with programmable current gain in which the slave mirroring transistor 21 is a simple transistor and the master mirroring transistor is a composite transistor comprising selectively parallelled simple transistors 11 and 22. When control voltage from source 25 as applied to terminal 26 and thence to the gate electrodes of transistors 23 and 24 is substantially positive, FET 24 is non-conductive and FET 23 is conductive to cause $V_{GS22} = 0$. FET 22 is a non-conductive and does not affect the CMA operation of FET's 11 and 21. Its drain-to-gate feedback causes FET 11 to develop a $V_{GS11}$ adequate to support conduction of $I_{IN}$ as $I_{DS11}$, just as in the FIG. 1 circuit, which $V_{GS11}$ is then applied as $V_{GS21}$ to FET 21 to cause an $I_{OUT}$ defined as follows.

$$I_{OUT} = -I_{DS21} = -(L_{11}W_{21}I_{DS11})/(L_{21}W_{11}) \quad (2)$$

where $L_{21}$ and $W_{21}$ are the length and width, respectively, of the channel of FET 21. For the circuit condition where FET 22 is non-conductive, the following obtains.

$$I_{DS11} = I_{IN} \quad (3)$$

$$I_{OUT} = -(L_{11}W_{21}I_{IN})/(L_{21}W_{11}) \quad (4)$$

When control voltage from source 25 is near ground potential or negative, FET 24 is conductive and FET 23 is non-conductive to bias FET 22 into conduction. This parallells self-biased FET 22 with self-biased FET 11. If, as shown, FET's 11 and 21 have equal W/L ratios, $I_{IN}$ will divide evenly between them.

$$I_{DS11} = I_{IN}/2 \quad (5)$$

For the circuit condition where FET 22 is conductive, substitution of equation 5 into equation 2 provides the following result.

$$I_{OUT} = -(\tfrac{1}{2})(L_{11}W_{21}I_{IN})/(L_{21}W_{11}) \quad (6)$$

Figure 4:
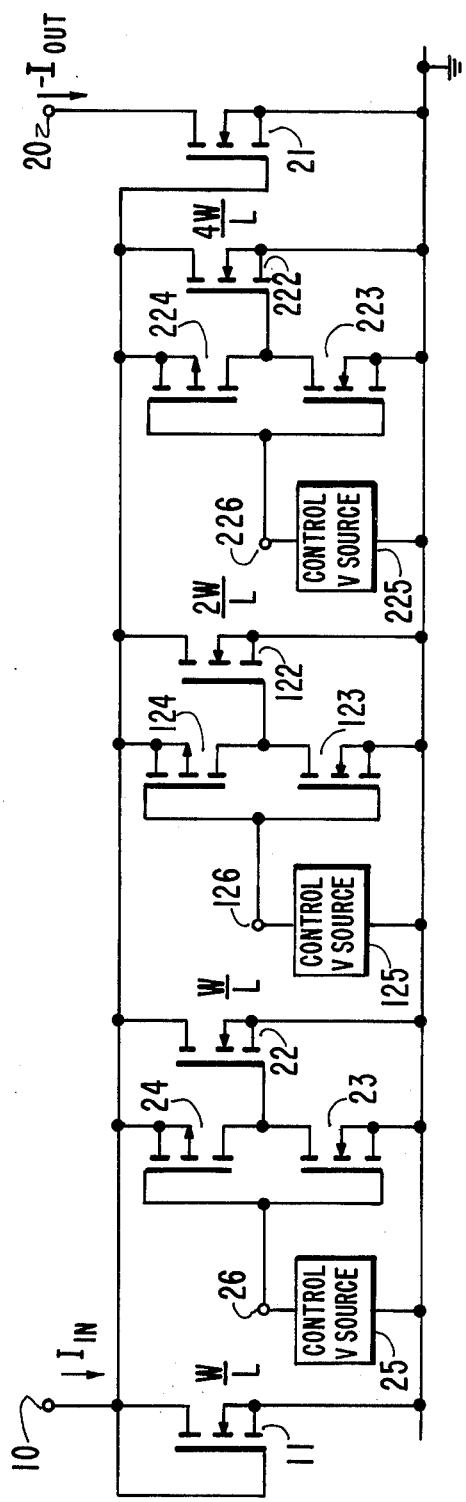
FIG. 4 is a schematic diagram of a circuit for dividing analog information by a digital number, constructed using the FIG. 3 circuit as a building block.

FIG. 4 shows a circuit useful in dividing analog information by digital numbers or, more specifically, as a type of digital-to-analog converter. It is built up using the FIG. 3 circuit as a basic building block. Elements 22, 23, 24, 25 and 26 are replicated a first time as elements 122, 123, 124, 125 and 126, respectively, and a second time as elements 222, 223, 224, 225 and 226, respectively, except that FET's 122 and 222 have (W/L)'s in 2:1 and 4:1 ratio, respectively with the W/L of FET 22. Sources 25, 125 and 225 may be viewed collectively as a parallel-bit digital signal source. Digital control numbers can be defined with each successive place representative of the output of source 25, 125 and 225 in that order, with the relatively low and relatively high control voltages provided by each source defined respectively as one and zero. The following table descriptive of the digital-to-analog conversion provided by the FIG. 4 circuit can then be developed.

| digital control signal | current gain |
|---|---|
| 000 | 1 |
| 001 | 1/2 |
| 010 | 1/3 |
| 011 | 1/4 |
| 100 | 1/5 |
| 101 | 1/6 |
| 110 | 1/7 |
| 111 | 1/8 |

One can divide analog information by a factor expressed in radix-2, or binary, form by subtracting unity from the factor to obtain the digital control signal.

This type of digital-to-analog conversion is particularly useful in applications such as programming the level of quiescent current applied to an operational transconductance amplifier, as described by Wheatley in U.S. Pat. No. 3,614,645, to provide an amplifier with digitally-controlled gain. The 000 digital control signal provides for full signal gain. Higher-value digital control signals as selectively developed, for example, by an operator-controlled up-down counter provide for desired values of reduced signal gain.

Figure 5:
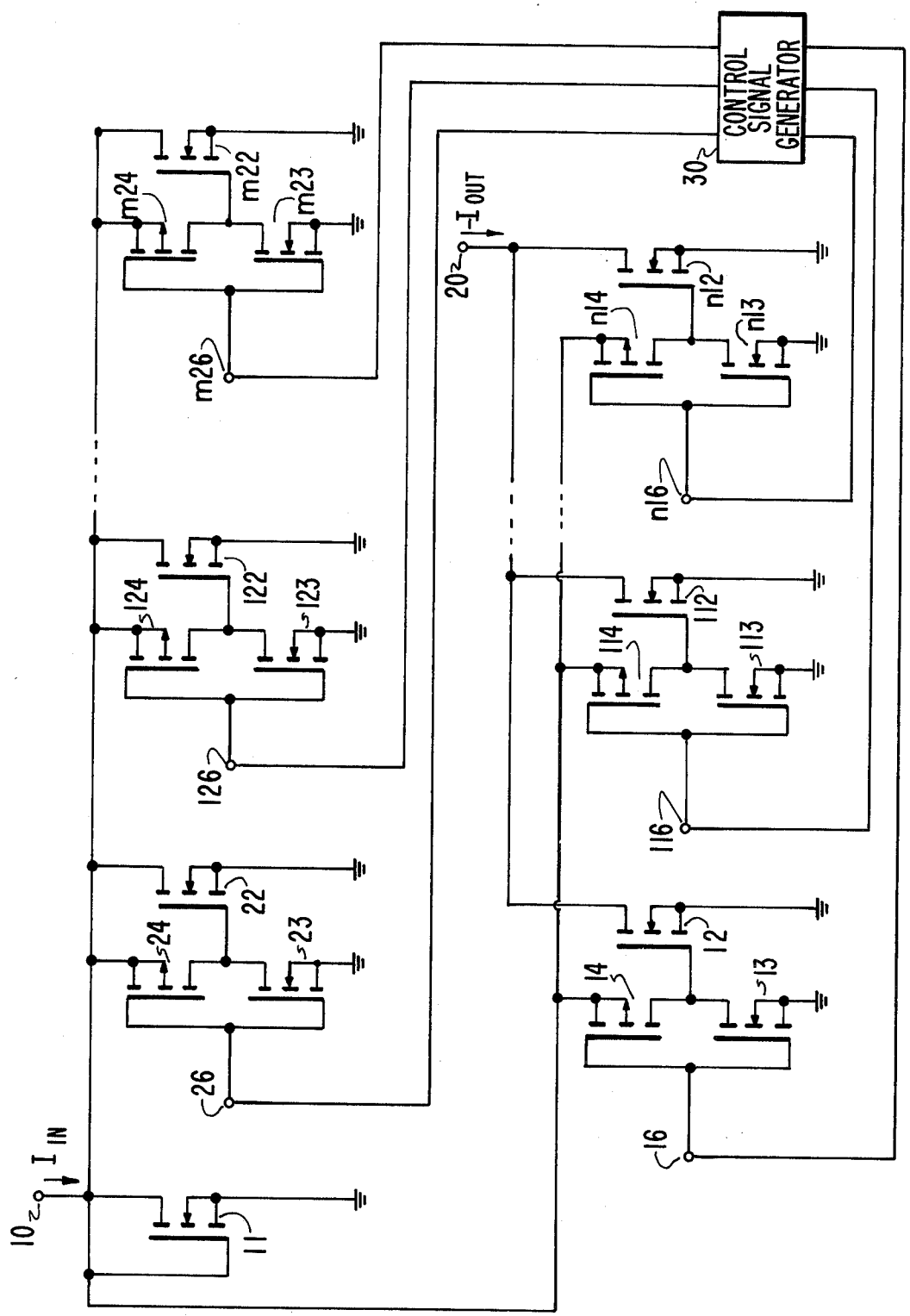
FIG. 5 is a schematic diagram of a circuit operable as a digital-to-analog converter constructed using the FIGS. 1 and 3 circuits as building blocks; and each of FIGS. 6 and 7 is a schematic diagram of a CMA with programmed current gain using cascode arrangements to reduce mismatch of the source-to-drain potentials of the mirroring FET's.

FIG. 5 shows a digital-to-analog converter in which both the master and slave mirroring transistors are composite transistors, comprised of pluralities, $(m+1)$, and $n$ respectively in number, where $m$ and $n$ are arbitrarily chosen positive numbers, of selectively parallelled simple transistors. Such converters are often the most economical of area on the integrated circuit. Control signal generator 30 develops parallel-bit digital control signals, of which preferably the coarser control bits control the programming of the composite transistor used as master mirroring transistor, and the finer control bits control the programming of the composite transistor used as the slave mirroring transistor.

Apparatus such as shown in FIG. 5 can with a properly designed control signal generator 30, implement simultaneous multiplication and division of analog information by digital numbers, combining the functions described in connection with the circuits of FIGS. 2 and 4 to permit programmable multiplication and division by non-integral rational numbers.

Figure 6:
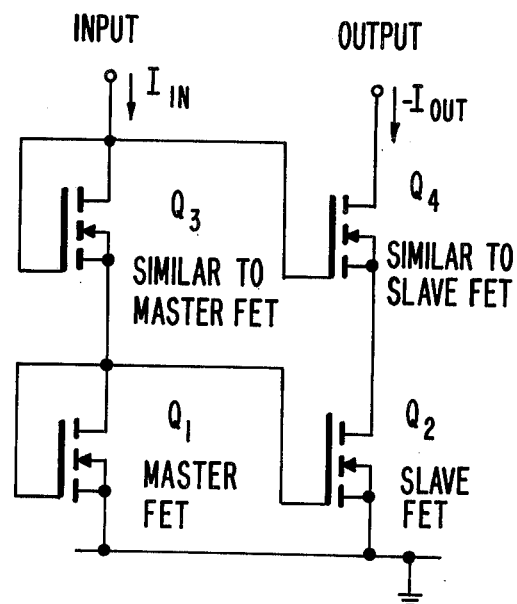
Figure 7:
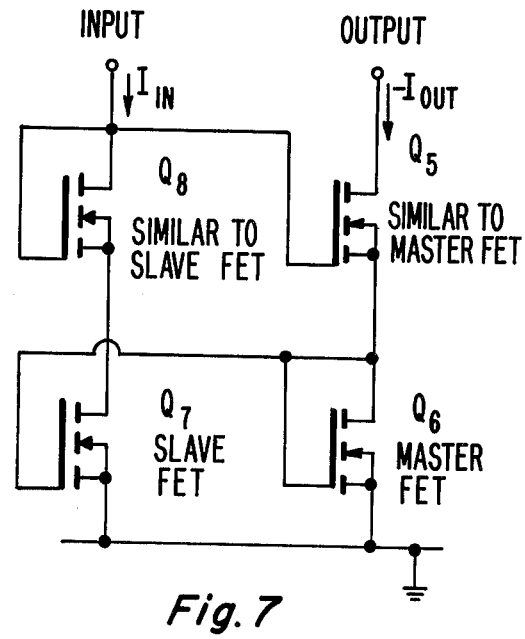

To improve the accuracy with which W/L ratios of FET's determine CMA current gain it is desirable to operate them with substantially equal $(V_{DS})$'s. Maintaining substantially equal $V_{DS}$'s is facilitated by operating the input FET's in cascode with another, common-gate amplifier FET connected thereafter. Some inaccuracy will remain if this common-gate amplifier FET has fixed transconductance. This is because the FET, being a low-transconductance device, has a $V_{GS}$ that changes with changing $I_{DS}$. FIGS. 6 and 7 show configurations which this undesirable effect is reduced still further.

In the FIG. 6 CMA with programmed current gain $Q_1$ and $Q_2$ are the master and slave mirroring transistors, respectively, and at least one of them is a composite transistor comprising selectively parallelled component FET's as described above. $Q_3$ and $Q_4$ match transistors $Q_1$ and $Q_2$, respectively, which may be more particularly described as follows. If $Q_1$ be a composite transistor with selectively parallelled transistors, so is $Q_3$; and the transconductance of $Q_3$ is programmed with the same digital signal that programs the transconductance of $Q_1$, so their transconductances track each other. If $Q_2$ be a composite transistor with selectively parallelled transistor, so is $Q_4$; and the transconductance of $Q_4$ is programmed with the same digital signal that programs the transconductance of $Q_2$. If $Q_1$ be a simple transistor, so is $Q_4$.

The FIG. 6 arrangement provides better matched $V_{DS}$'s for $Q_1$ and $Q_2$ in line with the teaching of Wittlinger in U.S. Pat. No. 3,835,410 regarding similar interconnections of simple transistors. Preferably, the composite FET $Q_3$ is similar in structure and in programming to composite master FET $Q_1$, and composite FET $Q_4$ is similar in structure and programming to composite slave FET $Q_2$. However, significant improvement in operating characteristics can be obtained even if $Q_3$ and $Q_4$ be simple FET's without programmed conductances. The cascoding procedure may be repeated, adding another self-biased transistor atop $Q_3$ to develop gate bias for a further common-gae amplifier FET cascaded after $Q_4$, to better match the $V_{DS}$'s of $Q_1$ and $Q_2$. Indeed, the cascoding procedure may be repeated until diminishing returns set in.

In FIG. 7, $Q_5$ is provided source-to-gate feedback by means including a component simple CMA comprising $Q_6$ and $Q_7$ to regulate current gain between INPUT and OUTPUT terminals to a value substantially reciprocally related to the current gain of the component simple CMA comprising $Q_6$ and $Q_7$. At least one of the transistors $Q_6$ and $Q_7$ is a composite transistor comprising selectively parallelled transistors, however. Preferably, $Q_6$ is made to match $Q_5$, both as to structure and programming, and $Q_8$ is made to match $Q_7$ both as to structure and programming. The configuration generally resembles one using simple transistors described by Wilson in U.S. Pat. No. 3,588,672 and, more particularly, resembles others using simple transistors described by Schade in U.S. Pat. No. 3,852,679. In the FIG. 7 configuration, there is no need for a continuously self-biased component FEt analogous to FET 11 in the composite master FET $Q_6$, and each of the component FET's of $Q_6$ may be provided with selectively applied self-biasing. The FIG. 7 configuration may replace that of FIG. 6 in the more complex cascode arrangements discussed in connection with FIG. 6.

Cascode output stages in the CMA's with programmed current gains also desirably provide for higher output impedance.

The foregoing description of the invention will suggest many alternative configurations to one skilled in the art of electronic design and the claims should be construed to include such configurations within their scope, unless there be specific language to the contrary. E.g., transistors 11, 12, 21, 22, 112, 122, 212, 222 and their like including $n22$ and $m12$ may be replaced by NPN bipolar transistors, which owing to the base leakage of bipolar transistors will permit gating with FET's 14, 114, 214 ... $n14$ and 24, 124, 224 ... $m24$ used either with or without FET's 13, 113, 213 ... $n13$ and 23, 123, 223 ... $m23$. Bipolar transistors have an advantage over FET's in that their transconductances tend to be little affected by emitter-to-collector potential variations.

In each of the configurations thusfar described, the switches provided by FET pairs 13, 14; 113, 114; 213, 214 ... $n13$, $n14$; 23, 24; 123, 124; 223, 224 ... $m23$, $m24$ may be replaced by pairs of FET's in which the series-arm and shunt-leg FET's are replaced by FET's of opposite conductivity type, without change in the conductivity type of the mirroring transistors. These alternative embodiments are less preferred since it is necessary to bias the gates of each pair of FET's to different potentials, introducing further circuit complexity. In arrangements using bipolar mirroring transistors with single FET's as switch elements, the FET's may be of either conductivity type, the choice preferably being made to facilitate simple coupling of the previous digital control signal generating circuitry to the programmable gain CMA.

Many of the circuit refinements used in conventional CMA design may be advantageously used— e.g., the follower transistors may be introduced into the self-biasing connection of self-biased transistors such as 11.

The programmable CMA's described above have used binary-weighting of the transconductances of the selectively parallelled mirroring transistors, but other weighting factors may be employed. Source degeneration resistors may be provided for the mirroring transistors and their resistances may be trimmed to adjust the programmed current gains to match design norms more closely. The parallel-bit digital control signals may be altered in order to facilitate various digital coding and/or decoding schemes.

What is claimed is:

1. A programmable-gain current mirror amplifier comprising:
    input, output and common terminals;
    first master and first slave mirroring transistors, each having first and second electrodes with a principal conduction path therebetween and having a control electrode, the conductance of the principal conduction path of each transistor being controlled according to control potential between its second and control electrodes;
    means connecting the first electrodes of said first master and said first slave mirroring transistors to said input terminal and to said output terminal, respectively;
    a direct-coupled feedback connection from the first electrode of said first master mirroring transistor to its control electrode;
    means connecting each of the second electrodes of said first master and said first slave mirroring transistors to said common terminal; and
    switching means for selectively connecting together the control electrodes of said first master and said first slave mirroring transistors.

2. A programmable-gain current mirror amplifier as set forth in claim 1 having:
    at least one further slave mirroring transistor each having first and second electrodes with a principal conduction path therebetween and having a control electrode, the conductance of the principal conduction path of each further slave mirroring transistor being controlled according to control potential between its second and control electrodes;
    means connecting the first and second electrodes of each further slave mirroring transistor to said output terminal and to said common terminal, respectively; and
    further switching means each associated with a respective further slave mirroring transistor for selectively connecting together the control electrodes of said first master and said respective further slave mirroring transistor.

3. A programmable-gain current mirror amplifier as set forth in claim 2 wherein the conductances of successively considered ones of said slave mirroring transistors for like control potentials are made such that the conductance of each succeeding one is twice that of the preceding one.

4. A programmable-gain current mirror amplifier as set forth in claim 2 wherein each said switching means comprises a respective first switching transistor having a principal conduction path used for selectively connecting and having a control electrode connected to receive a respective bit of a parallel-bit digital control signal manifestation.

5. A programmable-gain current mirror amplifier as set forth in claim 2 having:

at least one further master mirroring transistor, each having first and second electrodes with a principal conduction path therebetween and having a control electrode, the conductance of the principal conduction path of each further master mirroring transistor being controlled according to a control potential between its second and control electrodes;

means connecting the first and second electrodes of each further master mirroring transistor to said input terminal and to said common terminal, respectively; and still further switching means each associated with a respective further master mirroring transistor for selectively connecting together the control electrodes of said first master and said respective further master mirroring transistors.

6. A programmable-gain current mirror amplifier as set forth in claim 5 wherein the conductances of successively considered ones of said further master transistors for like control potentials are made such that the conductance of each succeeding one is twice that of the preceding one.

7. A programmable-gain current mirror amplifier as set forth in claim 5 wherein each said switching means comprises a respective first switching transistor having a principal conduction path used for selectively connecting and having a control electrode connected to receive a respective bit of a parallel-bit digital control signal manifestation.

8. A programmable-gain current mirror amplifier comprising:

input, output and common terminals;

first and further master mirroring transistors and a slave mirroring transistor, each transistor having first and second electrodes with a principal conduction path therebetween and having a control electrode, the conductance of the principal conduction path of each transistor being controlled according to control potential between its second and control electrodes;

means connecting the first electrodes of said master mirroring transistors to said input terminal;

means connecting the first electrode of said slave mirroring transistor to said output terminal;

a direct-coupled feedback connection from the first electrode of said first master transistor to its control electrode;

a connection between the control electrodes of said first transistor and said slave mirroring transistor;

means connecting each of the second electrodes of said master and slave mirroring transistors to said common terminal; and switching means each associated with a respective further master mirroring transistor for selectively connecting together the control electrodes of said first and said respective further master mirroring transistors.

9. A programmable-gain current mirror amplifier as set forth in claim 8 wherein the conductances of successively considered ones of said further master transistors for like control potentials are made such that the conductance of each succeeding one is twice that of the preceding one.

10. A programmable-gain current mirror amplifier as set forth in claim 8 wherein each said switching means comprises a respective first switching transistor having a principal conduction path used for selectively connecting and having a control electrode connected to receive a respective bit of a parallel-bit digital control signal manifestation.

11. A programmable-gain current mirror amplifier apparatus comprising:

a bus for application of a reference potential;

an input terminal for application of a reference current;

a control terminal for application of a digital control potential; and first and second and third field effect transistors of a first conductivity type and a fourth field effect transistor of a second conductivity type complementary to said first conductivity type, each of said transistors having gate and source and drain electrodes, the source electrodes of said first and said second and said third transistors being connected to said bus, said first transistor gate and drain electrodes and said fourth transistor source electrode being connected to said input terminal, the gate electrodes of said third and fourth transistors being connected to said control terminal and their drain electrodes being connected to said second transistor gate electrode, said second transistor drain electrode being available for further connection.

12. A programmable-gain current mirror amplifier apparatus as set forth in claim 11 wherein said second transistor drain electrode is connected to said input terminal and wherein there is a fifth field effect transistor of said first conductivity type, said fifth transistor having a source electrode connected to said bus, having a gate electrode connected to said input terminal, and having a drain electrode available for further connection.

13. A programmable-gain current mirror amplifier apparatus comprising:

a bus for application of a reference potential;

an input terminal for application of a reference current;

an output terminal for connection to supply an output current;

control means for providing a bit-parallel binary control signal manifestation;

first and second transistor means, each having an input connection and a common connection and an output connection, at least one of said first and said second transistor means having a transconductance selectably determinable between a plurality of values responsive to a portion of said control signal manifestation;

means coupling the common connection of each of said first and said second transistor means to said bus;

means coupling the output connection of said first transistor means to said input terminal;

means coupling the output connection of said second transistor means to said output terminal; and a pair of similar means respectively for coupling the input connection of said first transistor means to said input terminal and for coupling the input connection of said second transistor means to said input terminal.

* * * * *